(12) United States Patent
Masselink et al.

(10) Patent No.: US 7,893,425 B2
(45) Date of Patent: Feb. 22, 2011

(54) QUANTUM WELL STRUCTURE

(75) Inventors: William Ted Masselink, Berlin (DE); Mykhaylo Petrovych Semtsiv, Berlin (DE)

(73) Assignee: Humboldt-Universitaet zu Berlin, Berlin (DE)

( * ) Notice: Subject to any disclaimer, the term of this patent is extended or adjusted under 35 U.S.C. 154(b) by 478 days.

(21) Appl. No.: 10/566,431

(22) PCT Filed: Jun. 11, 2004

(86) PCT No.: PCT/EP2004/006314

§ 371 (c)(1),
(2), (4) Date: Aug. 10, 2006

(87) PCT Pub. No.: WO2005/022651

PCT Pub. Date: Mar. 10, 2005

(65) Prior Publication Data

US 2006/0274803 A1 Dec. 7, 2006

(30) Foreign Application Priority Data

Jul. 31, 2003 (DE) .................... 103 35 443

(51) Int. Cl.
*H01L 31/00* (2006.01)
(52) U.S. Cl. .................... 257/21; 257/E29.071
(58) Field of Classification Search ............. 257/21, 257/E29.071
See application file for complete search history.

(56) References Cited

U.S. PATENT DOCUMENTS

| | | | |
|---|---|---|---|
| 5,963,571 A | 10/1999 | Wingreen | |
| 6,239,449 B1 | 5/2001 | Fafard | |
| 6,423,980 B1 | 7/2002 | Bandara | |
| 6,521,967 B1 | 2/2003 | Bandara | |
| 6,541,788 B2 | 4/2003 | Petroff | |
| 6,573,527 B1 | 6/2003 | Sugiyama | |
| 2002/0075924 A1 | 6/2002 | Mukai | |
| 2002/0162995 A1 | 11/2002 | Horguchi et al. | |
| 2003/0052317 A1 | 3/2003 | Ohshima | |
| 2003/0059998 A1* | 3/2003 | Holonyak et al. | 438/200 |
| 2003/0127608 A1* | 7/2003 | Shields et al. | 250/493.1 |
| 2004/0099872 A1* | 5/2004 | McGill et al. | 257/94 |

(Continued)

FOREIGN PATENT DOCUMENTS

GB 2 352 087 A 1/2001

OTHER PUBLICATIONS

Mikhailov SA., "A New Type of Tunable Solid-State Far-Infared Lasers", Conf Lasers Electro Opt Eur Tech Dig, Sep. 14, 1998, p. 92.

(Continued)

*Primary Examiner*—Davienne Monbleau
*Assistant Examiner*—Matthew Reames
(74) *Attorney, Agent, or Firm*—Rothwell, Figg, Ernst & Manbeck, P.C.

(57) ABSTRACT

A quantum well structure according to the invention includes a quantum well layer (107) arranged between two barrier layers (109, 112). It is distinguished in that at least one of the barrier layers (109) includes nanostructures (110) which compensate or modulate a lateral homogeneity of the barrier layer (109), that exists without the nanostructures (110), that is to say a homogeneity in the directions extending perpendicularly to the stacking direction of the layers in the quantum well structure.

19 Claims, 5 Drawing Sheets

U.S. PATENT DOCUMENTS

2004/0129931 A1* 7/2004 Asryan et al. ............. 257/14

OTHER PUBLICATIONS

Walter et al., "Room-temperature continuous photopumped laser operation of coupled InP quantum dot andInGaP quantum . . . ", Applied Physics Letters, vol. 79, No. 13, Sep. 24, 2001., pp. 1956-1958.

Asahi H., "Self-Organized Quantum Wires and Dots in III-V Semiconductors", Advanced Materials, vol. 9, No. 13, Nov. 3, 1997, pp. 1019-1026.

Belyaev et al., "Positively charged defects associated with self-assembled quantum dot formation", Applied Physics Letters, vol. 76, No. 24, Jun. 12, 2000, pp. 3570-3572.

B.F. Levine "Quantum-Well-Infrared Photodetectors", Journal of Applied Physics 74, R1-R81, 1993.

F. Capasso et al. "Quantum Kaskade Laser: Ultrahigh-Speed Operation, Optical Wireless Communication, Narrow Linewidth, and Far-Infrared Emission", IEEED Journal of Quantum Electronics 38, 511-532, 2002.

J. Phillips et al. "Far-Infrared Photoconductivity in self-organized InAs Quantum Dots ", Applied Physics Letters 72, 2020-2022, 1998.

J. Phillips et al. "Self-Assembled InAs-GaAs Quantum-Dot Intersubband Detectors", IEEED Journal of Quantum Electronics 35, 936-943, 1999.

H. C. Liu et al. "Quantum Dot Infrared Photodetectors", Applied Physics Letters 78, 79 -81, 2001.

L. Rebohle, et al. "Energy Level Engineering in InAs Quantum-Dot Nanostructures", Applied Physics Letters 81, 2079-2081, 2002.

B.F. Levine, et al., Applied Physics Letters 52 (1988) 1481.

G. Hasnain, et al., Applied Physics Letters 56 (1990) 770.

P.M. Mooney, Journal of Applied Physics 67 (1990), R1.

A.E. Belyaev et al., Applied Physics Letters 76 (2000), 3570.

H. Asahi, Advanced Materials 9 (1997), 1019.

C. Sirtori, et al., Applied Physics Letters 61, 898.

Chung et al., "Coupled strained-layer InGaAs quantum well improvement of an InAs quantum do . . . ", Applied Physics Letters, vol. 79, No. 27, 2001, pp. 4500-4502.

F. Capasso et al. "Quantum Cascade Lasers: Ultrahigh-Speed Operation, Optical Wireless Communication, Narrow Linewidth, and Far-Infrared Emission", IEEE Journal of Quantum Electronics 38, 511-532, 2002.

J. Phillips et al. "Self-Assembled InAs-GaAs Quantum-Dot Intersubband Detectors", IEEE Journal of Quantum Electronics 35, 936-943, 1999.

B.F. Levine, et al., "InGaAs/InAlAs multiquantum well intersubband absorption at a wavelength of $\lambda=4.4$ μm", Applied Physics Letters 52 (18) May 2, 1998, pp. 1481-1483.

G. Hasnain, et al., "Mid-infrared detectors in the 3-5 μm band using bound to continuum state absorption in InGaAs/InAlAs multiquantum well structures", Applied Physics Letters 56 (8), Feb. 19, 1990, pp. 770-772.

P.M. Mooney, "Deep donor levels (DX centers) in III-V semiconductors", Journal of Applied Physics, 67 (3), Feb. 1, 1990, pp. R1-R26.

C. Sirtori, et al., "Quantum wells with localized states at energies above the barrier height: A Fabry-Perot electron filter", Applied Physics Letters 61 (8), Aug. 24, 1992, pp. 898-900.

Faist et al., "Bound-to-Continuum and Two-Phonon Resonance Quantum-Cascade Lasers for High Duty Cycle, High-Temperature Operation", IEEE Journal of Quantum Electronics, vol. 38, No. 6, Jun. 2002, pp. 533-546.

* cited by examiner

QUANTUM WELL STRUCTURE

CROSS REFERENCE TO RELATED APPLICATION

This application is a 35 USC §371 National Phase Entry Application from PCT/EP2004/006314, filed Jun. 11, 2004, and designating the United States.

The present invention concerns a quantum well structure as well as a quantum well photodetector and a quantum cascade laser.

A quantum well structure comprises two barrier layers of semiconductor material, and a so-called quantum well layer which is arranged between the two barrier layers and which is also made from a semiconductor material. The thickness of the quantum well layer, that is to say its extent in the normal direction (that is to say in the stacking direction of the layers) is generally markedly less than its lateral extent (that is to say perpendicularly to the stacking direction of the layers) and is typically only a few nm.

The electrical characteristics of a semiconductor material can be described with what is referred to as the band model. This states that various energy ranges, referred to as the energy bands, are available to the electrons of the semiconductor material, within which bands the electrons can assume substantially any energy values. Different bands can be separated from each other by a band gap, that is to say an energy range with energy values which the electrons cannot assume. The number of electrons which a band can accommodate is limited. For a semiconductor material, the completely filled band which is highest in terms of energy, referred to as the valence band, and the empty conduction band which is above the valence band in terms of energy, as well as the band gap between them, are of particular significance.

In quantum well structures as are used for example for quantum well infrared photodetectors, referred to for brevity as QWIPs, or quantum cascade lasers, referred to for brevity as QCLs, the semiconductor materials for the barrier layers and the quantum well layer are so selected that the conduction band of the barrier material is higher in energy terms than that of the quantum well material. The result of that choice is that the electrons of the quantum well layer cannot readily penetrate into the barrier layers so that they are enclosed in the quantum well layer.

In the quantum well layer, the characteristics of the electrons enclosed therein are determined by quantum-mechanics effects by virtue of the small thickness of the layer (a few nanometers). An essential effect in that respect is that the electrons in an energy band of the quantum well layer can no longer assume just any energy value within the energy range of the gap, but are fixed to the energy values of given energy levels. A change in the electron energy therefore does not occur continuously but abruptly from one energy level to another. It is only when the increase in energy or the decrease in energy which is experienced by an electron precisely corresponds to the difference in the energy values of two energy levels that it can change from one energy level to the other. Transitions from one energy level to another within one and the same band are referred to as intersubband transitions.

In QWIPs and QCLs, the intersubband transitions are utilised for the detection or emission of light of a given wavelength, that is to say the absorption or emission of photons of a given photon energy. The quantum well layers used for that purpose are very homogeneous as, in homogeneous quantum well layers, the energies of the energy levels can be accurately adjusted by a suitable choice of the thickness of the quantum well layer, and therewith also the energy of the photons which are to be absorbed or which are emitted. The energy values of the energy levels in the energy bands of a quantum well layer react in that case very sensitively to changes in the layer thickness. Quantum-mechanics principles, referred to as selection rules, permit however absorption or emission in such homogeneous quantum well layers only when the photon which is to be absorbed or the emitted photon has an electrical field whose polarisation direction is in the normal direction of the quantum well layer. As the electrical field of a photon is polarised perpendicularly in relation to its direction of propagation, this means that light which is incident in the normal direction of the quantum well layer cannot be detected (QWIP) or that no light is emitted in the normal direction (QCL). Detection or emission in the normal direction would be advantageous however as it would simplify coupling light into or out of the quantum well structure.

There are therefore various approaches for permitting the absorption of light which is incident in the normal direction or the emission of light in the normal direction.

U.S. Pat. No. 6,423,980 proposes for example arranging a diffraction grating over a quantum well structure for a QWIP, for deflecting a large part of the light incident in the normal direction, out of the normal direction, so that it is not propagated in the normal direction in the quantum well structure and accordingly can be absorbed. Actual absorption of photons which move in the quantum well structure in the normal direction does not however take place.

Another approach involves eliminating the cause of the described absorption and emission behaviour. The homogeneity of the quantum well layer also means that there is a homogeneous distribution in respect of electron density in the layer. That homogeneity in the distribution of the electron density is the reason why photons which are incident in the normal direction of the quantum well layer cannot be absorbed therein. Therefore for example J Phillips et al 'Self-assembled InAs—GaAs quantum dot intersubband detectors', IEEE Journal of Quantum Electronics 35, pages 936-943, 1999, proposed introducing quantum dots, that is to say quasi-one-dimensional structures, into the quantum well layer of a QWIP in order to cancel the homogeneity of the layer. The consequence of cancellation of homogeneity by the quantum dots is that even the absorption of light which is incident in the normal direction, that is to say photons whose electrical field is not polarised in the normal direction of the layer, is possible in the corresponding quantum well layer. However variations for example in the size of the quantum dots arranged in the quantum well layer give rise to difficulties in precisely adjusting the energy values of the energy levels in the quantum well layer, and thus adjusting the photon energy to be absorbed. In addition, for energy reasons, the quantum dots must be relatively widely spaced from each other in order to result in significant cancellation of the homogeneity. The wide spacing however results in a relatively low density in relation to surface area of the electrons as they are localised in the regions of the quantum dots, that is to say the electron density is high in the region of the quantum dots and low therebetween, and that has a detrimental effect on the absorption and emission characteristics of the quantum well layer. Finally the quantum dots also result in a limitation in the minimum possible thickness of the quantum well layer, and that restricts the adjustment options for the energies of the photons to be absorbed.

Therefore the object of the present invention is to provide an improved quantum well structure, a quantum well photodetector as well as a quantum cascade laser, which permit the absorption of light incident in the normal direction.

That object is attained by a quantum well structure as set forth in claim 1, a quantum well photodetector as set forth in claim 11 and a quantum cascade laser as set forth in claim 12. The appendant claims recite advantageous configurations of the quantum well structure according to the invention.

A quantum well structure according to the invention comprises a quantum well layer arranged between two barrier layers. It is distinguished in that at least one of the barrier layers comprises nanostructures which compensate or modulate a lateral homogeneity of the barrier layer, which is present without the nanostructures, that is to say a homogeneity in the directions which extend perpendicularly to the stacking direction of the layers in the quantum well structure. In that respect nanostructures are to be considered as structures which are of a dimension of 100 nm or less in at least one direction in which they extend. The nanostructures used in the quantum well structure according to the invention however preferably involve a dimension of a maximum of 50 nm in at least one direction in which they extend. Further preferably the dimension is in the range of between 5 and 15 nm.

The quantum well structure according to the invention permits the absorption or emission of photons in the normal direction of the quantum well layer without causing substantial difficulties in terms of precisely adjusting the energy values of the energy levels in the quantum well layer, and thus adjusting the photon energy to be absorbed. As, in the quantum well structure according to the invention, no quantum dots need to be present in the quantum well layer itself, the density in relation to surface area of the electrons of the quantum well structure is not substantially reduced. In addition, in the quantum well structure according to the invention, there is no substantial restriction in the minimum possible thickness of the layer so that a high degree of flexibility is possible in adjusting the energy values of photons to be absorbed or emitted.

The quantum well structure according to the invention is based on the considerations set forth hereinafter:

The typical materials which are used in the barrier layers and the quantum well layers are of a crystalline structure, that is to say their atoms involve a regular arrangement; they form the so-called lattice structure of the crystalline material. If the lattice structure of the material is continued substantially undisturbed it is to be viewed as a homogeneous material in terms of volume. Stretching and upsetting effects in respect of the lattice structure as a whole are in that respect essentially not to be viewed as disturbances.

If the homogeneity of the quantum well layer is disturbed by quantum dots as in the state of the art in order to permit absorption or emission of photons incident in the normal direction of the layer, that intervention in the quantum well layer influences adjustment of the energy values of the energy levels, in a manner which is difficult to foresee.

The invention is now based on the realisation that absorption or emission of photons incident in the normal direction of the layer can also be made possible by cancellation or modulation of the homogeneity of at least one of the barrier layers. The cause of this is that the homogeneity in terms of the distribution of electron density in the quantum well layer, which prevents the absorption of photons incident in the normal direction or the emission of photons in the normal direction, depends not just on the homogeneity of the grating structure of the quantum well layer, but also on the conditions at the interfaces in relation to the barrier layers. The conditions at the interfaces however also depend on the structure of the barrier layers. Therefore, cancelling or modulating the homogeneity of at least one barrier layer can cancel or modulate the homogeneity in respect of the distribution of electron density in the quantum well layer in the lateral direction without substantially influencing the lattice structure of the quantum well layer. Accordingly the energy values of the energy levels also remain substantially uninfluenced by cancellation or modulation of the homogeneity of at least one of the barrier layers so that the desired adjustment of the energy values is not detrimentally affected. In addition the density of the electrons in relation to surface area is not influenced as greatly as by quantum dots which are arranged in the quantum well layer.

In an advantageous configuration of the quantum well structure according to the invention the nanostructures present are self-organised three-dimensional structures which can be in the form in particular of quantum dots or quantum wires. The self-organised structures represent one possible way of specifically producing the nanostructures. In that respect, nanostructures whose dimensions in all lateral directions are less than 100 nm, preferably less than 50 nm, and are preferably in the range of between 5 and 15 nm, are to be viewed as quantum dots. Quantum wires are distinguished over quantum dots in that their extent in one lateral direction is markedly greater than in other lateral directions. In particular the quantum wires can also exceed the specified dimensions, in the corresponding lateral direction in which they extend. The dimension of the quantum wires or quantum dots in a vertical direction is not more than about 10 nm, in particular they are in the range of between 1 and 5 nm and preferably in the range of between 2 and 3 nm.

Materials whose lattice structure is markedly stretched in relation to the lattice structure of the barrier layer can be particularly well used to produce the self-organised structures. The greater the degree of stretching of the lattice structure, the correspondingly greater is the spacing of the atoms in the lattice from each other. A measurement in respect of the spacing of the atoms from each other in a lattice structure is the so-called lattice constant of the lattice structure. In an advantageous configuration of the nanostructures they are therefore made from a material which has a markedly greater lattice constant than the material of the barrier layer.

In a further configuration of the quantum well structure according to the invention the barrier layer is in the form of an aluminum arsenide layer (AlAs layer) with indium arsenide islands (InAs islands) as nanostructures or an indium phosphide layer (InP layer) within indium arsenide islands (InAs islands) as nanostructures. Processing of the specified materials is so wide-spread in semiconductor technology that it is possible to have recourse to an extensive range of experience in handling thereof in manufacture of the quantum well structure according to the invention.

In order to increase the efficiency of the quantum well structure in the absorption or emission of photons, a development of the quantum well structure according to the invention can provide two or more quantum well layers which are respectively separated from each other at least by a barrier layer.

A quantum cascade laser (QCL) according to the invention and a quantum well photodetector according to the invention which in particular can be in the form of a quantum well infrared photodetector (QWIP) each include at least one quantum well structure according to the invention.

Further features, properties and advantages of the present invention will be apparent from the description hereinafter of embodiments by way of example, with reference to the accompanying drawings.

Figure 1:
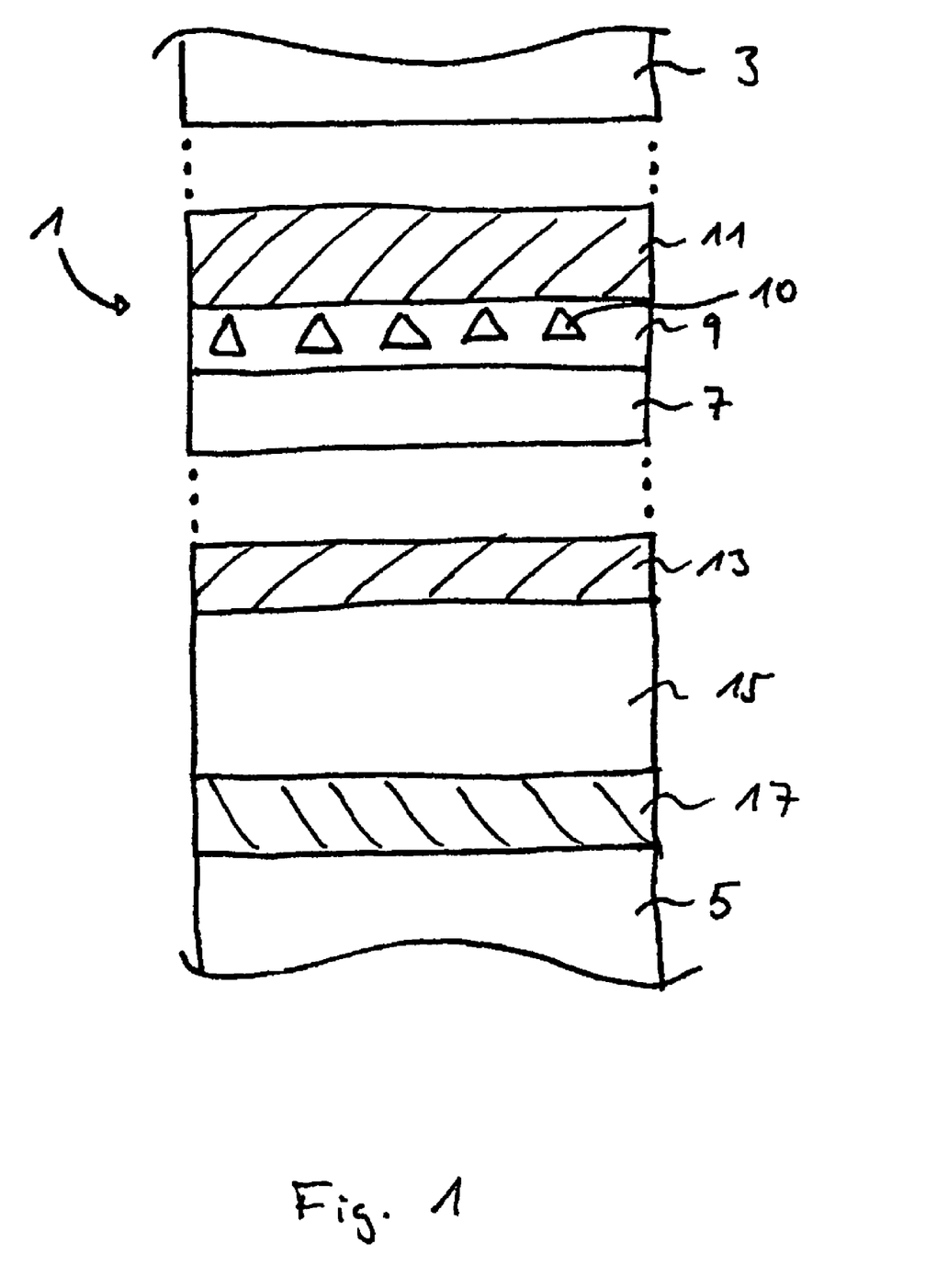
FIG. 1 is a diagrammatic view of a first infrared photodetector as a first embodiment of the quantum well structure according to the invention.

FIG. 1 diagrammatically shows as a first embodiment a specific form of the QWIP, more specifically what is referred to as a gamma valley normal incidence infrared photodetector, referred to hereinafter as the GV-GWIP. The term 'gamma valley' indicates a specific range of the energy band in which the intersubband transitions are to be found. It is not to be further described herein. Arranged in the GV-QWIP, between an upper contact and cover layer 3 and a lower contact layer 5, is a quantum well structure according to the invention in which absorption of photons takes place, leading to a measurable voltage in the detector. The upper contact layer 3 and the lower contact layer 5 are each in the form of a silicon-doped gallium arsenide layer (GaAs:Si) of a thickness of about 500 nm.

The quantum well structure is in the form of a periodic structure with 30 periods 1, of which only one is representatively illustrated in FIG. 1. Each period 1 includes a quantum well layer 7 of a layer thickness of about 4 nm, a barrier layer 9 arranged over the quantum well layer 7 and of a layer thickness of about 2.5 nm, and a spacer layer 11 arranged over the barrier layer 9 and of a layer thickness of about 25 nm, representing a further barrier layer. In the present embodiment the spacer layer 11 is in the form of an aluminum gallium arsenide layer (AlGaAs). Each quantum well layer 7 is thus arranged between two barrier layers, more specifically between the barrier layer 9 which adjoins the top side of the quantum well layer 7 and the spacer layer 11 of the next lower period 1, that is to say the period which is closer to the substrate.

The quantum well layer 7 is in the form of a silicon-doped gallium arsenide layer and represents the actual detector layer of the period, that is to say absorption of the photons takes place therein. In order to permit the absorption of photons which are incident in the normal direction of the quantum well layer 7 the barrier layer 9 includes indium arsenide islands 10 as nanostructures. The barrier layer 9 itself is in the form of an aluminum arsenide matrix for the indium arsenide islands 10. The lateral extent of the islands is less than 50 nm, preferably between 5 and 15 nm, and the extent thereof in the normal direction of the barrier layer 9 is about 1-5 nm, preferably 2-3 nm. In that case the islands 10 are so arranged in the barrier layer 9 that their spacing with respect to the quantum well layer 7 is in the range of between 0.3 and 2 nm. Preferably however the spacing should be in the range of between 0.5 and 1 nm. In the present embodiment the spacing is about 1 nm or somewhat less.

So that even the quantum well layer 7 of the lowermost period 1 is arranged between two barrier layers, adjoining the underside of that lowermost quantum well layer 7 is a lower spacer layer 13 which, like the other spacer layers 11, is in the form of an aluminum gallium arsenide layer. At the substrate side the spacer layer 13 is followed by a silicon-doped gallium arsenide layer 15 as a further spacer layer which does not serve as a barrier layer. In addition, between the silicon-doped gallium arsenide layer 15 and the substrate (not shown) there is a silicon-doped indium gallium phosphide layer (InGaP:Si) 17 which serves as an etching stop in production of the quantum well structure.

Figure 2:
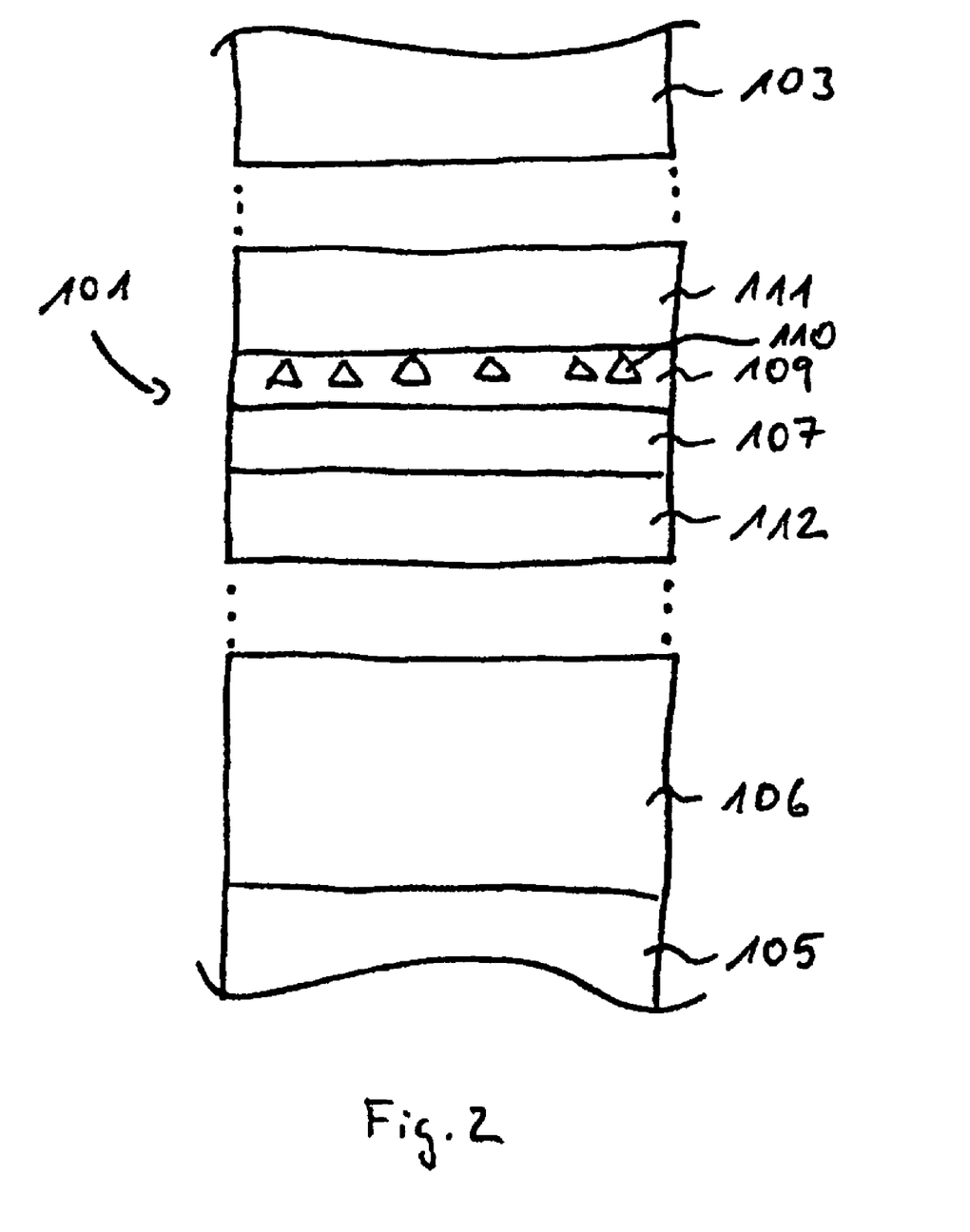
FIG. 2 is a diagrammatic view of a second infrared photodetector as a second embodiment of the quantum well structure according to the invention.

FIG. 2 shows an alternative configuration of the GV-QWIP as a second embodiment of the quantum well structure according to the invention. In the GV-QWIP shown in FIG. 2, as in the first embodiment, a quantum well structure according to the invention is arranged between an upper contact and cover layer 103 and a lower contact layer 105. In the present embodiment the upper contact layer 103 is in the form of a silicon-doped indium gallium arsenide layer (InGaAs:Si) of a thickness of about 500 nm while the lower contact layer 105 is in the form of a silicon-doped indium phosphide layer which at the same time represents the substrate of the GV-QWIP. An indium gallium arsenide layer which is about 200 nm thick is arranged as a buffer layer between the substrate 105 and the quantum well structure.

In the normal direction the quantum well structure is in the form of a periodic structure with 50 periods 101 of which only one is representatively illustrated in FIG. 2. Each period 101 of the second embodiment comprises a quantum well layer 107 of a layer thickness of about 4 nm, over which is arranged a barrier layer 109 of a layer thickness of at least between about 2 and 2.5 nm. Disposed over the barrier layer 109, as in the GV-QWIP of the first embodiment, is a spacer layer 111 of a layer thickness of about 25 nm, representing a further barrier layer. Unlike the GV-QWIP of the first embodiment, each period 107 also includes a further spacer layer 112 of a thickness of about 25 nm, which serves at the same time as a barrier layer and which at the substrate side adjoins the quantum well layer 107. Unlike the first embodiment the spacer layer 111 arranged over the barrier layer 109 is in the form of an indium aluminum arsenide layer, and likewise the spacer layer 112 which at the substrate side adjoins the quantum well layer 107.

In the second embodiment the quantum well layer 107 is in the form of a silicon-doped indium gallium arsenide layer (InGaAs:Si) and represents the actual detector layer of the period 101. The barrier layer 109 is in the form of an aluminum arsenide matrix in which indium arsenide islands 110 are embedded. The lateral extent of the islands is less than 50 nm, preferably being between 5 and 15 nm. The islands 110 which in the normal direction of the barrier layer 109 are of an extent of between 1 and 5 nm, preferably between 2 and 3 nm, are in this case arranged in the barrier layer 109 in such a way that their spacing relative to the quantum well layer is markedly less than 1 nm and in particular is between 0.5 and 0.8 nm.

Figure 3:
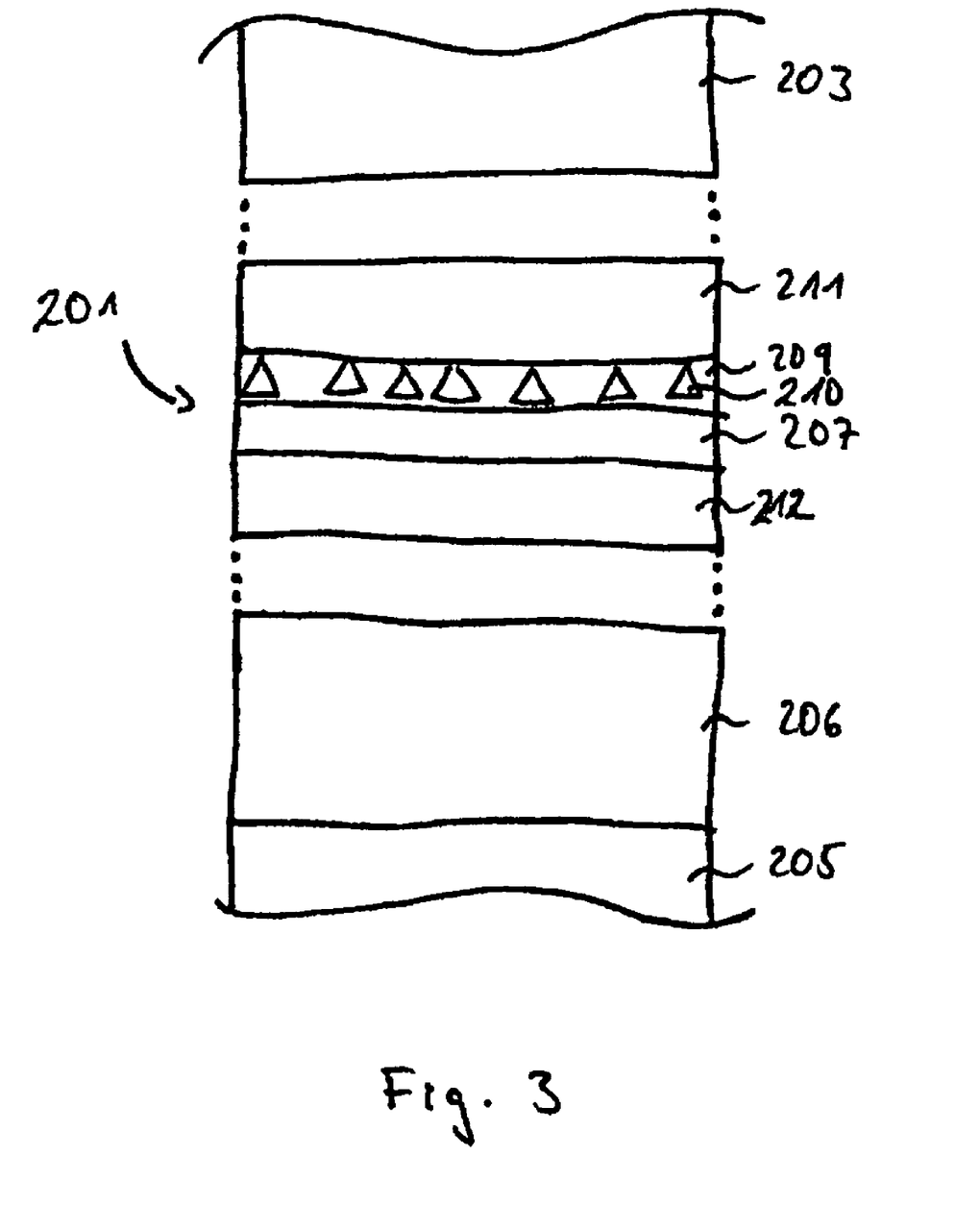
FIG. 3 is a diagrammatic view of a third infrared photodetector as a third embodiment of the quantum well structure according to the invention.

A third embodiment of the quantum well structure according to the invention is shown in FIG. 3. The embodiment represents a so-called X-valley normal incidence infrared photodetector, referred to hereinafter for brevity as an XV-QWIP. The term 'X-valley', like the term 'gamma valley', indicates a specific range of the energy band in which the intersubband transitions occur.

In the XV-QWIP shown in FIG. 3 a quantum well structure according to the invention is arranged between an upper contact and cover layer 203 of a thickness of about 500 nm and a lower contact layer 205 which at the same time represents the substrate of the XV-QWIP. In the third embodiment both contact layers 203, 205 are in the form of a silicon-doped gallium phosphide layer. In addition a further silicon-doped gallium phosphide layer which is about 200 nm thick is arranged as a buffer layer 206 between the substrate 205 and the quantum well structure.

As in the GV-QWIP of the second embodiment, in the normal direction the quantum well structure is in the form of a periodic structure with 50 periods 201 of which only one is representatively illustrated in FIG. 3. Each period 201 of the third embodiment comprises a quantum well layer 207 of a layer thickness of about 2.5 nm. Arranged over the quantum well layer 207 is a barrier layer 209 and thereover is a spacer layer 211 which represents a further barrier layer, of a layer thickness of about 25 nm. As in the case of the GV-QWIP of the second embodiment each period 207 also comprises a further spacer layer 212 of a thickness of about 25 nm, which serves at the same time as a barrier layer and which at the substrate side adjoins the quantum well layer 207. Both spacer layers 211, 212 are in the form of gallium phosphide layers (GaP).

In the XV-QWIP of the third embodiment the quantum well layer 207 is in the form of a silicon-doped aluminum phosphide layer (AlP:Si) and represents the actual detector layer of the period 201. The barrier layer 209 is in the form of an indium phosphide layer or in the form of a (Al,Ga)P matrix, that is to say a mixture of aluminum phosphide and gallium phosphide, in which indium arsenide islands 201 are embedded. The mixture (Al,Ga)P is in that respect also intended to include the limit cases of pure AlP or pure GaP. In this embodiment the lateral extent of the islands is also less than 50 nm, preferably being between 5 and 15 nm, and its extent in the normal direction of the barrier layer 209 is between 1 and 5 nm, preferably between 2 and 3 nm. In this case the islands 210 are so arranged in the barrier layer 209 that their spacing relative to the quantum well layer 7 is in the range of between 0 and 2 nm. In that respect the spacing of the islands 210 from the quantum well layer should be as small as possible, that is to say as close to zero as possible. In the present embodiment the islands 210 extend in the normal direction substantially through the entire barrier layer 209.

Figure 4:
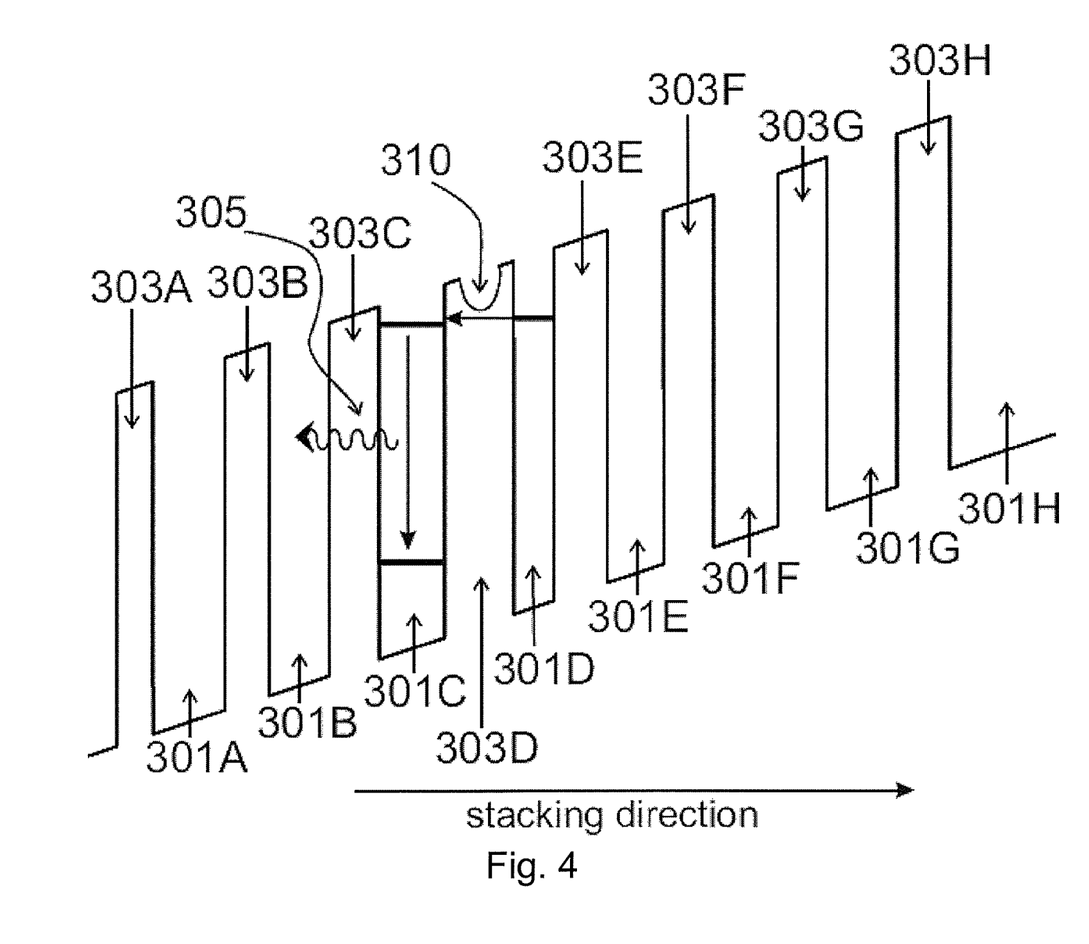
FIG. 4 is a diagrammatic view of a quantum cascade laser as a fourth embodiment of the quantum well structure according to the invention.

FIG. 4 diagrammatically shows an $Al_{0.3}Ga_{0.7}As/GaAs$ quantum cascade laser, QCL, as a fourth embodiment. The illustrated QCL comprises a periodic structure of which one period is shown in FIG. 4. That period can be repeated up to several thousand times in a QCL. Each period of the QCL comprises a number of mutually alternately arranged quantum well layers 301A-301H and barrier layers 303A-303H. In the present embodiment the quantum well layers 301A-301H are in the form of gallium arsenide layers and the barrier layers 303A-303C as well as the barrier layers 303E-303H are in the form of aluminum gallium arsenide layers (AlGaAs). The composition and structure of the barrier layer 303D is described hereinafter with reference to FIG. 5.

In a QCL intersubband transitions of electrons in the quantum well layer 301 are used for the emission of photons with a given photon energy. In that respect, in particular the quantum well layers 301C, 301D and the barrier layer 303D are of significance for the emission of photons. An electron which is in the quantum well layer 301D at an energy level of a high energy value can pass in a quantum-mechanics process through the barrier layer 303D into the quantum well layer 303C, in which respect reference is made to the electronic tunnelling through the barrier layer 303D. The physical properties of the layers 301C, 301D and 303D are so selected that, after tunnelling through the barrier layer 303D, the electron in the quantum well layer 303C goes from the energy level at the high energy value to an energy level at a low energy value, in which case it emits a photon 305 whose energy corresponds to the difference between the two energy values.

Arranged in the barrier level 303D are nanostructures 310 which modulate the homogeneity of the barrier layer 303D in the lateral direction and thus the lateral homogeneity of the distribution of the electron density in the quantum well layer 303C. The barrier layer 303D thus permits the emission of photons in the normal direction of the quantum well layer 303C without nullifying or modulating the homogeneity of the quantum well structure 303 itself.

Figure 5:
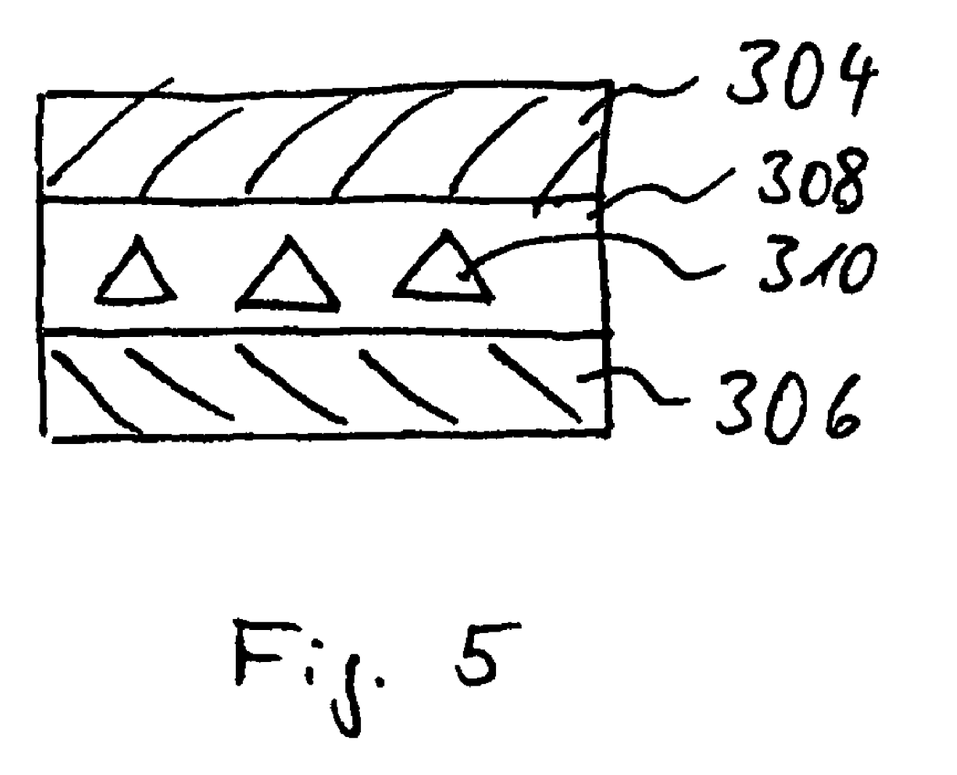
FIG. 5 shows a barrier layer of the fourth embodiment in detail.

The barrier layer 303D is shown in detail in FIG. 5. Arranged between two aluminum gallium arsenide layers 304 and 306 of a thickness of about 1.4 nm and 0.8 nm respectively is an aluminum arsenide layer 303 serving as a matrix for indium arsenide islands 310 as nanostructures. In the normal direction of the aluminum arsenide layer 308 the indium arsenide islands 301 are of a dimension of about 0.6 nm. They are embedded in the aluminum arsenide layer 308 in such a way that they are at a respective spacing of about 0.6 nm in relation to the aluminum gallium arsenide layers 304 and 306. In total the thickness of the aluminum arsenide layer 308 is therefore about 1.8 nm so that the barrier layer 303D is overall about 4 nm in thickness.

In the described embodiments the lateral dimensions of the nanostructures are so selected that in the lateral direction they are no greater than about 50 nm and are preferably in the range of between 5 and 15 nm. Such small structures can also be viewed as quantum dots. The optimum dimensions of the quantum dots can depend in that case on the material used. Instead of being in the form of quantum dots however the nanostructures can also be in the form of quantum wires and in particular also can be of a greater dimension than 50 nm in the lateral direction without substantially impairing the function which they perform as nanostructures in accordance with the invention.

The described embodiments describe aluminum arsenide barrier layers with indium arsenide islands as nanostructures as well as (In,Ga,Al)P layers (that is to say layers comprising a mixture of indium, gallium and aluminum phosphide, wherein the mixture can also be pure indium, gallium or aluminum phosphide) with indium arsenide islands as nanostructures. The present invention however is not limited to that choice of material. Rather, a large number of combinations of materials is suitable, which are preferably so selected that the material used for the islands has a markedly greater lattice constant than the material used for the barrier layer as that requires self-organisation of the islands in the barrier material.

The layers described in the embodiments by way of example can be produced in known manner for example by molecular beam epitaxy (MBE) or by means of chemical gaseous phase deposition (CVD).

The invention claimed is:

1. A quantum well structure comprising quantum well layers stacked in a stacking direction between barrier layers, said quantum well layers comprising two subbands having two energy levels, said barrier layers comprising nanostructures.

2. The quantum well structure of claim 1, wherein the quantum well layer comprises an energy band with energy levels of differing energy, and wherein the energy values of the energy levels are so adjusted that absorption or emission of photons occurs with a given wavelength.

3. The quantum well structure of claim 1, wherein said nanostructures are self-organized three-dimensional structures.

4. The quantum well structure of claim 1, wherein said self-organized three-dimensional structures are made from a material which has a greater lattice constant than the material of the barrier layer.

5. The quantum well structure of claim 3 wherein said self-organized three-dimensional nanostructures are in the form of quantum dots.

6. The quantum well structure of claim 3, wherein said self-organized three-dimensional nanostructures are in the form of quantum wires.

7. The quantum well structure of claim 1, wherein at least one of the barrier layers is in the form of an aluminum arsenide layer having indium arsenide islands as nanostructures.

8. The quantum well structure of claim 1, wherein at least one of the barrier layers is in the form of an indium phosphide layer having indium arsenide islands as nanostructures.

9. The quantum well structure of claim 1 comprising at least two quantum well layers separated from each other at least by a respective barrier layer.

10. The quantum well structure of claim 1, wherein the nanostructures are of a dimension of less than 50 nm in at least one lateral direction in which they extend.

11. The quantum well structure of claim 10, wherein said dimension is in the range of between 5 and 15 nm.

12. A quantum well photodetector comprising at least one quantum well structure as set forth in claim 1.

13. A quantum cascade laser comprising at least one quantum well structure comprising cascades of quantum well layers stacked in a stacking direction between barrier layers, said quantum well layers comprising two subbands having two energy levels, wherein at least one of said barrier layers comprises nanostructures, and comprising intersubband transition regions between said cascades.

14. A quantum well structure comprising quantum well layers having different energy subband values;
said quantum wells containing means for intersubband transition in said quantum well layers;
wherein said quantum well layers are stacked in a stacking direction between barrier layers, and
wherein said barrier layers comprise nanostructures configured to cancel or modulate the homogeneity of electron state density distribution extending in at least one direction perpendicular to the stacking direction of said quantum well layers in the absence of said nanostructures.

15. A method of forming an improved quantum well structure, comprising the steps of stacking quantum well layers in a stacking direction between barrier layers, wherein said barrier layers comprise nanostructures, and configuring the electronic structure of said structure such that said quantum well layers comprise two subbands having two energy levels.

16. A method for absorbing or emitting photons from intersubband transitions in a quantum well structure comprising the steps of
providing a plurality of quantum well layers comprising two subbands having two energy levels, said quantum well layers being separated by barrier layers stacked in a stacking direction;
configuring said quantum well structure such that electrons undergo intersubband transitions and emit or absorb photons in said quantum well layers;
providing a means for cancelling or modulating homogeneity of electron state density distribution in said quantum well layers comprising incorporating nanostructures into at least one of said barrier layers, said nanostructures being configured to cancel or modulate the homogeneity of electron state density distribution extending in at least one direction perpendicular to the stacking direction of said quantum well layers in the absence of said nanostructures; and
configuring the electronic structure of said quantum well structure such that said nanostructures have a ground state higher than the energy values of subbands involved in transitions from one energy level to another energy level in adjacent quantum well layers such that said electrons do not tunnel into said nanostructures.

17. A method for permitting an electron to absorb or emit a photon in a quantum well layer of a quantum well structure comprising the steps of
providing quantum well layers having different energy values separated by barrier layers stacked in a stacking direction wherein said electron undergoes intersubband transitions in said quantum well layers, and
providing a means for cancelling or modulating homogeneity of electron state density distribution in said quantum well layers, wherein said means comprises nanostructures configured to cancel or modulate the homogeneity of electron state density distribution extending in at least one direction perpendicular to the stacking direction of said quantum well layers in the absence of said nanostructures, wherein said nanostructures have a ground state higher than the energy values of subbands involved in transitions from one energy level to another energy level in adjacent quantum well layers such that said electrons do not tunnel into said nanostructures, and
wherein electrons tunnel through barrier layers and go from an energy level at a high energy value to an energy level at a low energy value in a first quantum well layer and emit a photon in said first quantum well layer or electrons originate from an energy level at low energy value in a second quantum well layer to absorb a photon in said second quantum well layer.

18. A quantum well structure comprising quantum well layers stacked in a stacking direction between barrier layers, wherein at least one of said barrier layers comprises nanostructures, and said nanostructures have a ground state higher than the energy values of subbands involved in transitions from one energy level to another energy level in adjacent quantum well layers in the stacking direction.

19. A quantum well structure comprising a power supply, quantum well layers stacked in a stacking direction between barrier layers, at least one of said barrier layers comprising nanostructures, wherein said power supply is configured to prevent carriers from tunneling from said quantum wells into said nanostructures.

* * * * *